United States Patent
Van Der Wijst (10) Patent No.: US 6,731,349 B1
(45) Date of Patent: May 4, 2004

(54) TUNER WITH AT LEAST A FIRST AND A SECOND FREQUENCY BAND

(75) Inventor: Hendrikus Martinus Van Der Wijst, Veldhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 395 days.

(21) Appl. No.: 09/614,809

(22) Filed: Jul. 12, 2000

(30) Foreign Application Priority Data

Jul. 13, 1999 (DE) ......................................... 199 32 563

(51) Int. Cl.[7] .............................................. H04N 5/50
(52) U.S. Cl. ........................ 348/732; 348/731; 348/536; 455/161.1; 455/180.1; 455/188.1; 455/193.1
(58) Field of Search ................................ 348/731, 732, 348/733, 536, 570, 705; 455/161.1–161.3, 179.1, 180.1, 180.3, 188.1, 67.4, 193.1, 226.1; H04N 51/50

(56) References Cited

U.S. PATENT DOCUMENTS

| | | | | |
|---|---|---|---|---|
| 3,778,736 A | * | 12/1973 | Sakamoto ..................... 334/15 |
| 3,821,651 A | * | 6/1974 | Fathauer et al. ......... 455/166.1 |
| 3,895,303 A | * | 7/1975 | Imazeki et al. .......... 455/168.1 |
| 3,913,020 A | * | 10/1975 | Van Anrooy ............. 455/180.3 |
| 4,063,179 A | * | 12/1977 | Brown ..................... 455/166.1 |
| 4,220,973 A | * | 9/1980 | Macchetta .................. 348/732 |
| 4,249,256 A | * | 2/1981 | Molinari et al. ......... 455/180.4 |
| 4,387,401 A | * | 6/1983 | Henderson et al. ......... 348/732 |
| 4,398,303 A | * | 8/1983 | Chin et al. ............... 455/168.1 |
| 4,410,913 A | * | 10/1983 | Chin et al. .................. 348/570 |
| 4,418,428 A | * | 11/1983 | Evans ...................... 455/180.2 |
| 4,426,734 A | * | 1/1984 | Tults et al. .............. 455/180.3 |
| 4,429,415 A | * | 1/1984 | Chin et al. ............... 455/164.1 |
| 4,624,014 A | * | 11/1986 | Chen ....................... 455/168.1 |
| 4,763,195 A | * | 8/1988 | Tults .......................... 348/732 |
| 5,087,977 A | * | 2/1992 | Suizu ......................... 348/732 |
| 5,152,012 A | * | 9/1992 | Schwob ................... 455/158.5 |
| 5,163,161 A | * | 11/1992 | Bowles et al. ........... 455/164.1 |
| 5,371,550 A | * | 12/1994 | Shibutani et al. ........... 348/570 |
| 5,428,405 A | * | 6/1995 | Lee ............................. 348/731 |
| 5,479,214 A | * | 12/1995 | Sakakibara et al. ......... 348/558 |
| 5,584,051 A | * | 12/1996 | Goken .......................... 455/68 |
| 5,621,767 A | * | 4/1997 | Brandt et al. ................ 375/344 |
| 5,710,994 A | * | 1/1998 | Shiota ......................... 455/260 |
| 5,737,035 A | * | 4/1998 | Rotzoll ....................... 348/725 |
| 6,035,185 A | * | 3/2000 | Dobrovolny et al. ....... 455/266 |
| 6,038,433 A | * | 3/2000 | Vegt ......................... 455/161.1 |
| 6,108,050 A | * | 8/2000 | Yamamoto et al. ......... 348/731 |
| 6,122,493 A | * | 9/2000 | Kobayashi et al. ...... 455/193.1 |
| 6,125,269 A | * | 9/2000 | Brekelmans ............. 455/180.1 |
| 6,163,684 A | * | 12/2000 | Birleson .................. 455/182.3 |
| 6,177,964 B1 | * | 1/2001 | Birleson et al. ............ 348/725 |
| 6,297,858 B1 | * | 10/2001 | Yang ........................... 348/731 |
| 6,340,997 B1 | * | 1/2002 | Borseth ....................... 348/731 |
| 6,392,715 B1 | * | 5/2002 | Sato et al. ................... 348/731 |
| 6,438,361 B1 | * | 8/2002 | Chong et al. ............. 455/188.1 |
| 6,480,707 B1 | * | 11/2002 | Hirose et al. ............. 455/179.1 |
| 6,493,544 B1 | * | 12/2002 | Baxley et al. ........... 455/161.1 |

FOREIGN PATENT DOCUMENTS

KR   1998-015278   * 8/1996

* cited by examiner

*Primary Examiner*—John Miller
*Assistant Examiner*—Brian Yenke (57) ABSTRACT

The invention relates to a tuner with at least a first and a second frequency band and with means for effecting a switch-over between the frequency bands, which tuner comprises a signal input terminal for the supply of a frequency information signal.

The invention is characterized in that the tuner comprises a band selection circuit which is provided for the selection and control of one frequency band at a time, and in that the tuner comprises a frequency search function for tuning to a frequency, which function in a first step is designed to test the tuning possibility of the frequency in the first frequency band and, if tuning in the first frequency band is not possible, in a second step is designed for testing the tuning possibility of the frequency in the second frequency band.

10 Claims, 5 Drawing Sheets

TUNER WITH AT LEAST A FIRST AND A SECOND FREQUENCY BAND

The invention relates to a tuner with at least a first and a second frequency band and with a signal input terminal for the supply of a frequency information signal.

The invention further relates to an integrated circuit with a PLL circuit for controlling a tuner which comprises at least a first and a second frequency band.

Such a tuner and such an integrated circuit are known, for example, from the tuner UV 316 of the Philips company. This known tuner is manufactured in accordance with the WSP (World Standard Pinning) standard. The WSP standard lays down the mechanical dimensions, the functions of the individual connection terminals of the tuner, as well as the antenna height. Terrestrial tuners usually comprise two or three frequency bands, each comprising a tunable input filter, a controllable amplifier, a tunable band-pass filter, and a mixer circuit. Three pins are available for the supply of one control signal each for the control and selection of the frequency bands in the WSP. The control of the tuner takes place by means of the microprocessor of the TV set which is coupled to the tuner, for example, by means of a I$^2$C bus. A table is stored in known TV sets for the selection of the frequency band, by means of which table the frequencies of the TV signal which can be selected are associated with the respective frequency band of the tuner. When the user of the TV set selects a TV signal frequency, for example by means of a remote control unit, the microprocessor of the TV set selects the associated frequency band of the tuner from the table and transmits the control signals defining the band selection to the tuner.

The selection of the frequency bands of the tuner by means of the microprocessor of the TV set has the disadvantage that only tuners can be used for the TV set whose frequency bands correspond to the values stored in the table of the TV set. A subsequent change in the tuner as regards the characteristics of the frequency bands, or the use of a different tuner is no longer possible.

It is an object of the invention to provide a tuner as well as an integrated circuit of the kind mentioned in the opening paragraphs which are universally applicable.

According to the invention, this object is achieved with regard to the tuner in that the tuner comprises a band selection circuit which is provided for the selection and control of one frequency band at a time, and in that the tuner comprises a frequency search function for tuning to a frequency, which function in a first step is designed to test the tuning possibility of the frequency in the first frequency band and, if tuning in the first frequency band is not possible, in a second step is designed for testing the tuning possibility of the frequency in the second frequency band.

The tuner according to the invention thus evaluates the frequency information signal supplied to it by the microprocessor of the TV set and independently selects the frequency band in dependence on this frequency information signal. To render it possible for the tuner to select the frequency band independently, this tuner comprises a frequency search function. This frequency search function is designed such that it is consecutively tested in at least two different frequency bands whether a desired frequency can be tuned in the relevant frequency band.

Each frequency band has a mixer circuit with an oscillator for driving the mixer. The oscillator preferably comprises an oscillation circuit with a controllable capacitance. The controllable capacitance is preferably implemented as a reverse-biased varicap diode whose capacitance depends on the bias voltage applied. The oscillator frequency of the oscillation circuit can be controlled through a change in the bias voltage and the resulting change in the capacitance. Terrestrial tuners are usually designed for the conversion of input frequencies in a range from 45 MHz to 863 MHz. Since the controllable or adjustable capacitance range of the varicap diodes is limited, the tuners preferably comprise three frequency bands, each with its own oscillation circuit and with its own varicap diode designed for tuning the oscillation circuit. Testing of the tuning possibility accordingly means that it is tested whether the oscillator of the relevant frequency band can be tuned to the desired frequency which is necessary for mixing to the intermediate frequency of the tuner. The oscillation circuits are preferably coupled to a quartz oscillator by means of a programmable divider circuit. To synchronize the oscillation circuit with the quartz oscillator, a phase-locked loop (PLL) is preferably provided. The test as to whether a desired frequency can be tuned in one of the frequency bands may take place by means of a latching detector which detects whether the phase control circuit latches or locks itself, i.e. whether the desired oscillator frequency of the oscillation circuit can be synchronized with the reference frequency of the quartz oscillator, a programmable divider circuit being provided between the oscillation circuit and the quartz oscillator.

The individual frequency bands usually each comprise a band-pass filter which is formed by a coil and a varicap (variable-capacitance) diode connected in parallel thereto. The barrier layer capacitance of the varicap diode is dependent on the applied bias voltage and can thus be controlled through a change in the applied bias voltage. The varicap diodes of the band-pass filter and the varicap diodes of the oscillation circuits are preferably controlled in parallel during the tuning.

When a frequency information signal with a desired frequency is supplied to the tuner, the oscillation frequency of the oscillator of the first frequency band is scanned from the lowest band frequency to the highest band frequency in a first step. It is tested during this whether the desired frequency is tunable in the first frequency band. If the desired frequency could not be tuned in the first frequency band, a switch-over to the second frequency band takes place automatically, where the respective oscillator again is scanned continuously from the lower band limit to the upper band limit for tuning to the desired frequency.

This principle may also be applied in tuners having three or more frequency bands, for example, in the case of three frequency bands, the tuning is attempted first in the first, then in the second, and finally in the third frequency band.

The independent band selection of the tuner by means of the band selection circuit and the frequency search function has the advantage that a tuner of this construction can be used in any TV set whatsoever. Neither the software of the microprocessor of the TV set nor the software of the tuner need be changed for this purpose. Such a tuner can thus be manufactured efficiently and inexpensively in very large quantities. It is in addition possible to change the physical parameters of the individual frequency bands without a change in the software of the tuner being necessary. For example, the band boundaries of the frequency bands can be shifted through the use of different varicap diodes or other inductances for the respective band-pass filters and oscillation circuits. No change in the tuner software is necessary in such a case, because the tuner changes the switch-over points between the individual frequency bands automatically.

An example embodiment of the invention renders it possible to avoid an unnecessary switching-over between the frequency bands. The band selection circuit determines a tuning mode in accordance with the frequency difference between the old and the new frequency information signal as determined by the frequency difference detection circuit, which signal is supplied to the tuner, for example, by the microprocessor of the TV set. This tuning mode influences the further band selection, i.e. it determines whether and under what conditions a band switch-over between the frequency bands will take place.

According to an example embodiment, tuning modes which can be distinguished by the frequency difference detection circuit are, for example, a refresh mode, and/or an automatic frequency control mode, and/or a search mode, and/or a new-channel selection mode. It is detected in the refresh mode that the microprocessor of the TV set has once more sent the same frequency information signal to the tuner. In such a case, a band switch is not desirable, and accordingly no band switch is provided for in the refresh mode. In the automatic frequency control mode, the frequency difference detection circuit recognizes that the frequency information signal supplied to the tuner differs only very little from the old frequency information signal. This is characteristic of the automatic frequency control mode of a TV set. In such an automatic frequency control mode, the intermediate frequency demodulator sends a control signal for frequency fine tuning, which is supplied to the microprocessor of the TV set. The microprocessor of the TV set then supplies an only very slightly changed frequency information signal to the tuner. Such a case can be detected by the frequency difference detection circuit, and an unnecessary band switch can be avoided. Advantageously, a further tuning mode which can be recognized by the frequency difference detection circuit is a search mode. TV sets comprise such a search mode for systematically scanning through the individual frequency bands in search of TV channels which can be received. In such a case, the microprocessor of the TV set continuously changes the frequency information signal supplied to the tuner in programmable frequency steps. When a receivable channel is detected, the frequency data of this channel can be stored in a memory automatically or manually. When the microprocessor of the TV set carries out such a search mode operation, a frequency band switch is only desired when the end of the present frequency band has been reached. A frequency band switch is accordingly provided only upon reaching of the end of a frequency band in the search mode of the tuner. Furthermore, the frequency difference detection circuit advantageously is capable of distinguishing a new-channel selection mode. In this new-channel selection mode, the band selection circuit recognizes that a frequency information signal corresponding to a new channel is supplied to the tuner. This is recognized from the fact that the frequency difference between the old and the new frequency information signal exceeds a programmable minimum value. The frequency band setting in the new-channel selection mode takes place by means of the frequency search function, which first tests whether the frequency belonging to the desired channel can be tuned in the first frequency band. If this is not possible, a tuning is attempted in the second frequency band in a second step. The band switch between the first and the second frequency band takes place automatically upon reaching of the band end. The frequency difference characteristic of the search mode lies above the frequency difference of the automatic frequency control mode and below the frequency difference of the new-channel selection mode.

According to an example embodiment, the band selection circuit comprises a band preselection circuit for the adjustment of a new channel, i.e. in the new-channel selection mode. This band preselection circuit subdivides the frequency information signals supplied to the tuner into unequivocal and equivocal frequency information signals. In the case of unequivocal frequency information signals, the band preselection circuit makes an unequivocal and final decision on the frequency band to be assigned to the frequency information signal. In the case of equivocal frequency information signals, it is tested in a first step by means of the frequency search function whether the frequency belonging to the desired channel can be tuned in the first frequency band. If the desired channel cannot be tuned in the first frequency band, the tuner switches automatically to the second frequency band and tests whether the desired channel can be tuned in the second frequency band.

In an example embodiment of the band preselection circuit, the band preselection circuit classifies the frequency information signals of the at least two frequency bands into at least two groups. The first group comprises those frequency information signals which can be unequivocally associated with the first frequency band as well as those frequency information signals whose accompanying reception signal could lie both in the first and in the second frequency band. The second group comprises those frequency information signals whose accompanying reception signal must unequivocally lie in the second frequency band. This means that a frequency band switch-over can only be necessary within the first group, if at all. If the band preselection circuit determines that a frequency information signal belongs to the first group, it is first tested whether the frequency can be tuned in the first frequency band. If the desired frequency cannot be tuned in the first frequency band, the tuner switches automatically to the second frequency band and attempts the tuning in the second frequency band. In the second group of frequency information signals, a switch is immediately made to the second frequency band, and no automatic band switch-over is provided.

An alternative subdivision of the frequency information signals into three groups is provided in an example embodiment. Here the first group comprises those frequency information signals which can be unequivocally assigned to the first frequency band, and the third group comprises those frequency information signals which can be unequivocally assigned to the second frequency band. A second group of frequency information signals is provided between the former two, where the relevant frequency signals may lie either in the first or in the second frequency band of the tuner. This means that no automatic band switch-over by means of the frequency search function is available in the first and the third group. In the middle, second group, however, it is first tested in the first frequency band whether a frequency signal belonging to the frequency information signal can be tuned and, if unsuccessful in the first frequency band, an automatic switch is made to the second frequency band.

In an example embodiment, the bias voltage (or tuning voltage) applied to the varicap diodes of the respective band-pass filters and the respective oscillation circuits is evaluated by a band end detector. This band end detector compares the tuning voltage with a programmable threshold value and supplies a control signal when this threshold value is exceeded. The tuner then switches automatically to the next frequency band and tries to tune the desired frequency in the next frequency band.

Switching-over between the individual frequency bands may advantageously be carried out by means of an example embodiment. In this embodiment, the band selection circuit comprises a cyclical shift register with n elements, n corresponding to the number of frequency bands of the tuner. Thus, for example, a shift register with three elements is provided for a tuner with three frequency bands. Each of these three elements contains a control information, preferably of one bit each, which is provided for controlling a respective one of the three frequency bands. Two of the three elements contain, for example, the control information "0", which means that the frequency band belonging to this element should not be switched on. One of the three elements contains the control information "1" at any time, which means that the frequency band belonging to this element is switched on and that a tuning to the desired frequency is to be carried out in this frequency band. It is safeguarded thereby that only one of the three frequency bands is switched on at any time and that the tuning process is carried out in only one of the three frequency bands. When the band end detector detects the end of the respective frequency band, it supplies a control signal to the cyclical shift register, with the result that the control data are passed on to the respective adjoining control element. This means that the frequency band switched on until now takes over the control information "0" from the previous control element and is switched off. The control information "1" is passed on to the next control element, so that the frequency band belonging to the next control element is switched on, and the tuning to the desired frequency is attempted in this frequency band.

Such an organization of the frequency band switching by means of a shift register can be realized in a simple manner and is very reliable.

The first frequency band, which is scanned first during setting of a new channel, preferably lies below the second frequency band according to an example embodiment. This is particularly advantageous in tuners with three frequency bands in which the band switch-over is realized by means of a shift register, because it renders possible a simple shifting of the control information at the band end.

The tuners according to the invention are preferably constructed such that an overlap is provided in the boundary region between two frequency bands, so that in this overlap region a frequency can be tuned both in the first frequency band and in the second frequency band. In the overlap region, the noise is lower in the lower frequency band than in the higher frequency band, and the gain is higher in the lower frequency band than in the higher frequency band. It is accordingly advantageous in the case of equivocal frequency information signals to start the tuning process in the lower frequency band and, if no result is obtained in the lower frequency band, to switch over to the next higher frequency band.

The tuners according to the invention are preferably utilized in TV appliances.

The object of the invention as regards the integrated circuit according to the invention is achieved in that the integrated circuit comprises a band selection circuit which is designed for supplying control signals for the selection of a frequency band in dependence on the frequency information signal, and in that said band selection circuit comprises a frequency search function for tuning to a frequency, which function in a first step is designed for testing the tuning possibility of the frequency in the first frequency band and, if tuning in the first frequency band is not possible, in a second step is designed for testing the tuning possibility of the frequency in the second frequency band.

Such an integrated circuit may be used for tuners with various frequency band subdivisions, without any change in the software being required. Such an integrated circuit may accordingly be manufactured in very large quantities.

A few diagrammatically depicted embodiments of the invention will be explained in more detail below with reference to the drawing comprising FIGS. 1 to 7, in which.

Figure 1:
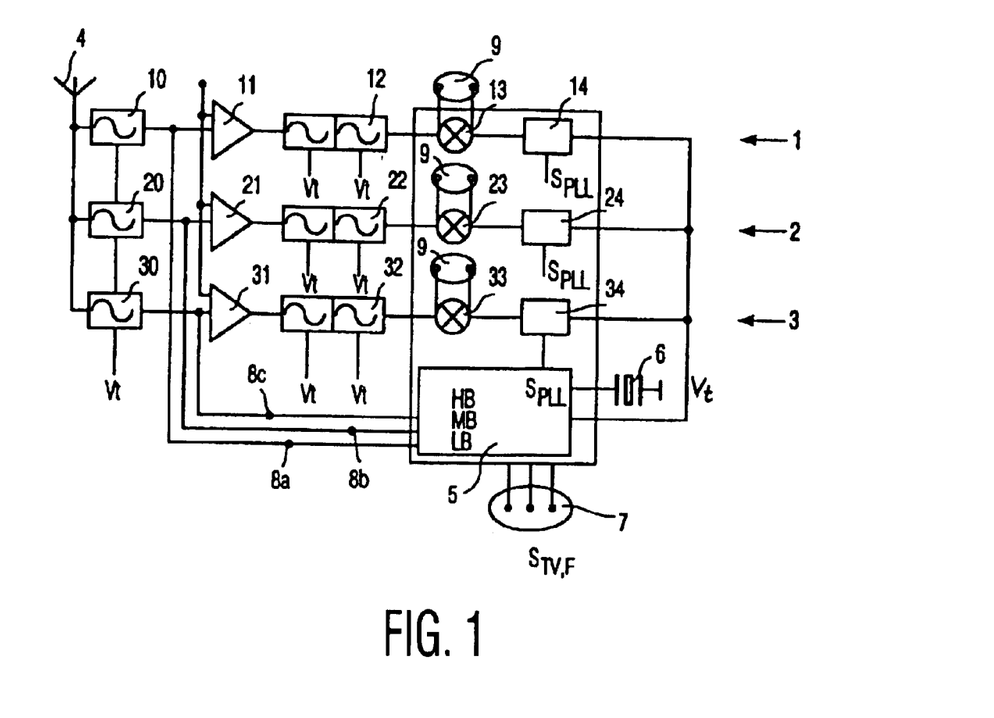
FIG. 1 is a circuit block diagram of a tuner with three frequency bands.

FIG. 1 is a block diagram showing the operating principle of a tuner with a first frequency band 1, a second frequency band 2, and a third frequency band 3. The first frequency band 1, the second frequency band 2, and the third frequency band 3 are connected in parallel and are coupled to an antenna 4. The first frequency band 1 comprises a series arrangement of a tunable input filter 10, an amplifier 11, a tunable band-pass filter 12, a mixer 13, and a tunable oscillator 14. The second frequency band 2 comprises a series arrangement of a tunable input filter 20, an amplifier 21, a tunable band-pass filter 22, a mixer 23, and a tunable oscillator 24.

Figure 2:
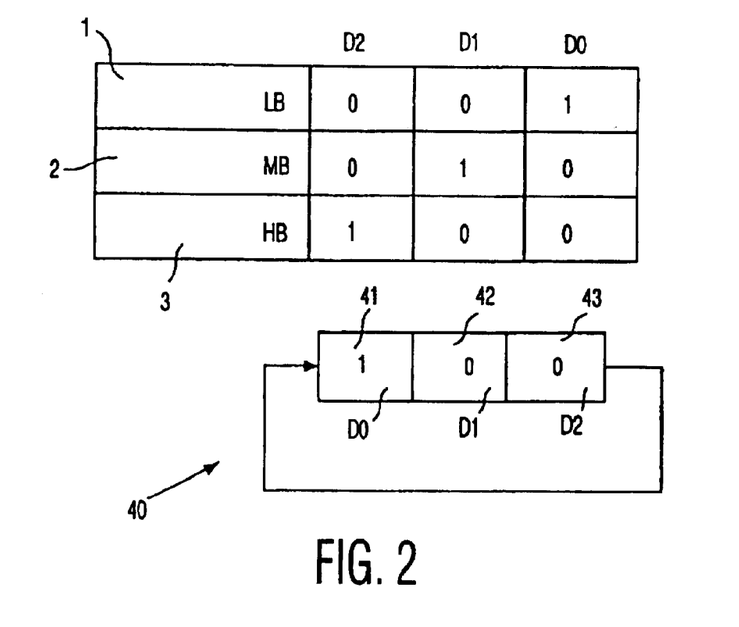
FIG. 2 shows the operating principle of a control mechanism for the automatic band switch-over between the individual frequency bands by means of a shift register.

The third frequency band 3 comprises a series arrangement of a tunable input filter 30, an amplifier 31, a tunable band-pass filter 32, a mixer 33, and a tunable oscillator 34. The reception signal received by the antenna 4 is supplied in parallel to the input filter 10 of the first frequency band 1, the input filter 20 of the second frequency band 2, and the input filter 30 of the third frequency band 3. An integrated circuit 5, which comprises inter alia a PLL circuit (not shown in any detail), is provided for controlling the tuner. The integrated circuit 5 is coupled to a quartz oscillator 6. The integrated circuit 5 supplies a control signal $S_{PLL}$ to the oscillator 14 of the first frequency band 1, to the oscillator 24 of the second frequency band 2, and to the oscillator 34 of the third frequency band 3. Furthermore, the integrated circuit 5 supplies a tuning voltage $V_t$ to the oscillator 14, the oscillator 24, and the oscillator 34. This tuning voltage $V_t$ controls as a bias voltage the barrier layer capacitance of the varicap diodes of the tunable filters and the tunable oscillators. The integrated circuit 5 comprises several control inputs 7 by means of which control signals $S_{TV}$ and a frequency information signal F can be supplied to the integrated circuit 5, for example via an I²C bus, by a TV set. The tuning voltage $V_t$ is also supplied by the integrated circuit 5 to the input filter 10 and the band-pass filter 12 of the first frequency band 1, to the input filter 20 and the band-pass filter 22 of the second frequency band 2, and to the input filter 30 and the band-pass filter 32 of the third frequency band 3. This renders it possible to carry out a parallel tuning of the input filters, band-pass filters, and oscillation circuits of the respective frequency band. The integrated circuit 5 is coupled to the integrated amplifier 11 by means of a control line 8a, to the amplifier 21 by means of a control line 8b, and to the amplifier 31 by means of a control line 8c. The control lines 8a, 8b, and 8c are designed for supplying control signals for the band selection, i.e. of the first, the second, or the third frequency band. The amplifier 11, the amplifier 21, and the amplifier 31 can be switched on and off by means of these control signals, such that one of the three frequency bands is selected at any time. The mixer 13 of the first frequency band 1, the mixer 23 of the second frequency band 2, and the mixer 33 of the third frequency band 3 have a common intermediate frequency output 9. This is indicated in FIG. 2 in that the intermediate frequency outputs of the three mixers have all been given the same reference numeral 9.

A frequency information signal F is supplied to the tuner through the control input 7 for the reception of a reception signal supplied by the antenna 4. Depending on this frequency information signal F, the integrated circuit 5 selects one of the three frequency bands 1, 2, or 3 through switching-on of the amplifier 11 of the first frequency band 1, the amplifier 21 of the second frequency band 2, or the amplifier 31 of the third frequency band 3. Furthermore, PLL control signals $S_{PLL}$ are supplied to one of the three oscillators 14, 24, 34. The integrated circuit 5 also supplies tuning voltages $V_t$ for tuning to the oscillators 14, 24, and 34, to the band-pass filters 12, 22, and 32, and to the input filters 10, 20, and 30. It is attempted by means of the control signals $S_{PLL}$ and the tuning voltage $V_t$ to tune the relevant oscillation circuit of the frequency band selected for tuning to the oscillator frequency resulting from the desired reception frequency and the intermediate frequency. For this purpose, the center frequency of the band-pass filter of the selected frequency band and the oscillator frequency of the oscillation circuits of the respective oscillator are shifted from the lower frequency band limit to the upper frequency band limit by means of the tuning voltage $V_t$ and it is tested whether the desired frequency can be set by means of the oscillator of the respective frequency band. This is preferably done in that a PLL latching detector monitors whether the phase control circuit of the integrated circuit 5 which controls the tuning process locks in.

The intermediate frequency output 9 is coupled to an intermediate frequency demodulator (not shown) via a surface acoustic wave filter. The intermediate frequency demodulator is in addition provided for generating a signal for the automatic amplification control.

The integrated circuit 5 comprises a band selection circuit which is not shown in any detail in FIG. 1 and which is designed for an independent selection of one of the three frequency bands 1, 2, 3 in dependence on the frequency information signal F supplied to the integrated circuit 5 via the control inputs 7. A first possibility of realizing such a band selection circuit in a simple manner is shown in the form of a functional diagram in FIG. 2. According to FIG. 2, a first control bit D0, a second control bit D1, and a third control bit D2 are provided for selecting the first frequency band 1, the second frequency band 2, and the third frequency band 3. The first control bit D0 is designed to be transmitted through the control line 8a to the amplifier 11 of the first frequency band 1, the second control bit D1 for being transmitted through the control line 8b to the amplifier 21 of the second frequency band 2, and the third control bit D2 for being transmitted through the control line 8c to the amplifier 31 of the third frequency band 3.

The first frequency band 1 is assumed to be the lowest frequency band of the tuner for the present example. This will be referred to as LB (Low Band) hereinafter. The second frequency band 2 is the mid-frequency band of the tuner. It is referred to as MB (Mid Band) hereinafter. The third frequency band is the upper frequency band of the tuner. It will be referred to as HB (High Band) hereinafter. FIG. 2 shows the correspondence table between the values of the control bits D0, D1 and D2 and the respective selected frequency bands LB, MB and HB. If the first control bit D0 is "1" and the second control bit D1 and the third control bit D2 are "0", then the low frequency band LB is selected and accordingly only the amplifier 11 of the low frequency band LB is switched on. When the second control bit D1 assumes the value "1", the mid-frequency band MB is selected. When the third control bit D2 assumes the value "1", the high frequency band HB is selected. The switch-over of bands between the low frequency band LB, the mid-frequency band MB, and the high frequency band HB may advantageously be realized by means of a shift register 40 as shown in FIG. 2, which comprises a first memory field 41, a second memory field 42, and a third memory field 43. The first memory field 41 is provided for storing the first control bit D0, the second memory field 42 for storing the second control bit D1, and the third memory field 43 for storing the third control bit D2. The first memory field 41 contains the control information "1", the second memory field 42 the control information "0", and the third memory field 43 the control information "0". This configuration is set at the start of a tuning procedure in the simplified band selection circuit shown in FIG. 2. When a fresh frequency information signal is supplied to the tuner at the control input 7, accordingly, first the low frequency band LB is switched on by the band selection circuit, and the tuner will attempt to tune the desired frequency in the low frequency band LB. If this is not possible, the information stored in the shift register 40 is shifted one memory field further each time, such that the second memory field 42 takes the control information "1" and the mid-frequency band MB is switched on. The tuner subsequently attempts to tune the oscillator of the mid-frequency band MB to the desired frequency. If this is not possible, the control information of the shift register is again shifted one memory location further, so that the third memory field 43 receives the control information "1" and the tuner switches to the high frequency band HB. It is now finally attempted in the high frequency band HB to tune the oscillator of this frequency band to the desired frequency. The testing in succession of the low frequency band LB, the mid-frequency band MB, and the high frequency band HB for the tuning possibility of the desired frequency causes comparatively long tuning or searching times for those frequencies which lie in the high frequency band HB.

Figure 3:
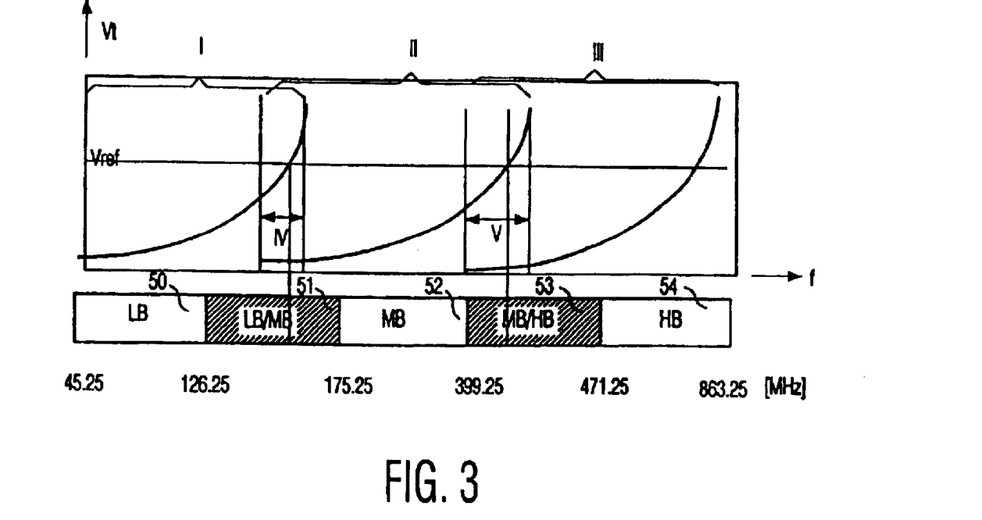
FIG. 3 shows the gradients of the tuning voltages of the three frequency bands of a three-band tuner plotted against the frequency, also showing the subdivision of the entire frequency range of the tuner into three unequivocal and two equivocal frequency band regions by means of a band preselection circuit, FIG. 4 plots the tuning voltage against the frequency as in FIG. 3, also showing the subdivision of the entire frequency range of the tuner into two equivocal and one unequivocal frequency band regions by means of a band preselection circuit.

An advantageous embodiment for shortening these search times is shown in FIG. 3. FIG. 3 shows the tuning voltage $V_t$ by means of which the varicap diodes of the band-pass filters 12, 22, and 32 and of the oscillators 14, 24, and 34 of the tuner of FIG. 1 can be tuned as a function of frequency. The region I shows the gradient of the tuning voltage $V_t$ of the first frequency band 1 against the frequency, the region II the gradient of the tuning voltage $V_t$ of the second frequency band 2 against the frequency, and the region III the gradient of the tuning voltage $V_t$ of the third frequency band 3. The region I and the region II overlap in a region IV. The region III and the region II overlap in a region V. In the overlap region IV, a frequency may be tuned both in the first frequency band 1 and in the second frequency band 2. In the overlap region V, a frequency may be tuned both in the second frequency band 2 and in the third frequency band 3.

The entire frequency range of all terrestrial tuners, i.e. the range embracing the individual frequency band ranges of the tuners of all TV standards, extends from 45.25 MHz to 863.25 MHz. In FIG. 3, this entire frequency band range is subdivided into a first group 50, a second group 51, a third group 52, a fourth group 53, and a fifth group 54 by means of a band preselection circuit which is not shown in any detail in FIG. 3. The band preselection circuit is preferably integrated into the integrated circuit 5 of FIG. 1. The first group 50 comprises the frequency band range from 45.25 MHz to 126.25 MHz, the second group 51 the frequency band range from 126.25 MHz to 175.25 MHz, the third group 52 the frequency band range from 175.25 MHz to 399.25 MHz, the fourth group 53 the frequency band range from 399.25 MHz to 471.25 MHz, and the fifth group 54 finally the frequency band range from 471.25 MHz to 863.25 MHz. When a new frequency information signal for setting a new reception channel is supplied by the microprocessor of the TV to the tuner, the band preselection circuit makes a preliminary selection of the frequency band from the groups 50 to 54 shown in FIG. 3. The first group 50 unequivocally corresponds to the low frequency band LB, the second group 52 may correspond to the low frequency band LB or the mid-frequency band MB, the third group 52 corresponds unequivocally to the mid-frequency band MB, the fourth group 53 may correspond to the mid-frequency band MB or to the high frequency band HB, and the fifth group 54 corresponds to the high frequency band HB. If the frequency information signal supplied to the tuner lies in the first group 50, the third group 52, or the fifth group 54, the band preselection circuit makes a definite decision on the frequency band belonging to this frequency information signal. The tuner is switched to the low frequency band LB in the case of frequency information signals in the first group 50, the tuner is switched to the mid-frequency band MB in the case of the third group 52, and to the high frequency band HB in the case of the fifth group 54. In the second group 51, the tuner is first switched to the low frequency band LB and it is attempted to tune to the desired frequency in this low frequency band. If the tuning attempt in the low frequency band LB is not successful, the tuner switches automatically to the mid-frequency band MB and tries to tune to the desired frequency in the mid-frequency band MB. Similarly, it is first attempted to tune to the desired frequency in the mid-frequency band in the case of frequency information signals in the fourth group 53. If this is not successful, the tuner switches automatically to the high frequency band HB and tries to tune to the desired frequency in this frequency band.

The software and control electronics of a tuner as shown in FIG. 3 may be used for all tuners whose switching points between the low frequency band LB and the mid-frequency band MB lie within the second group 51 and whose switching points between the mid-frequency band MB and the high frequency band HB lie within the range of the fourth group 53. The boundaries of the second group 51 and the fourth group 53 are set such that they embrace the switching points between the individual frequency bands of all commercially available tuners. The frequency band boundaries of the groups 50 to 54 may be modified so as to suit alternative applications. The tuning time can be substantially shortened by means of the subdivision of the entire frequency band range into the groups 50 to 54, because the frequency band range to be searched is substantially narrowed.

Figure 4:
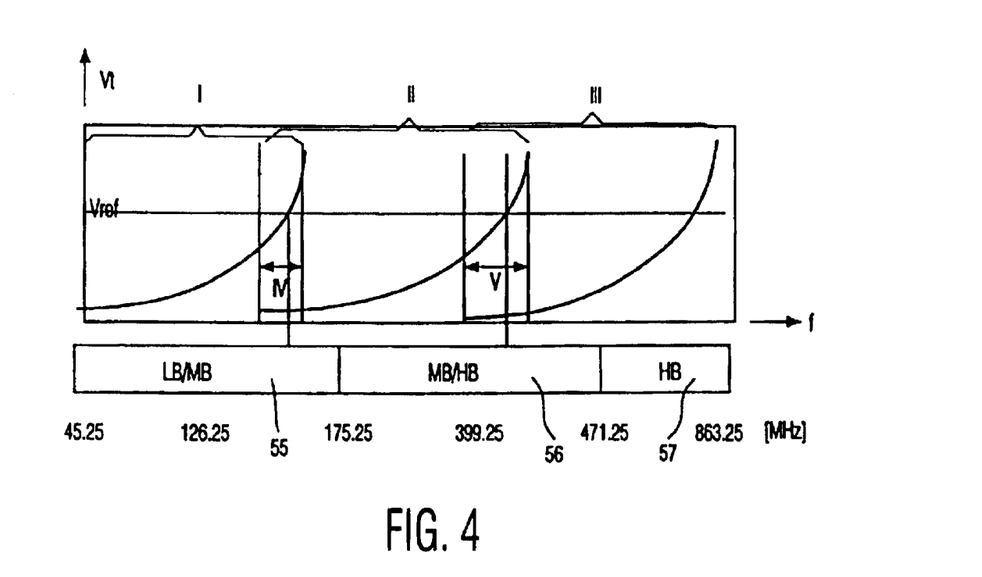
Figure 5:
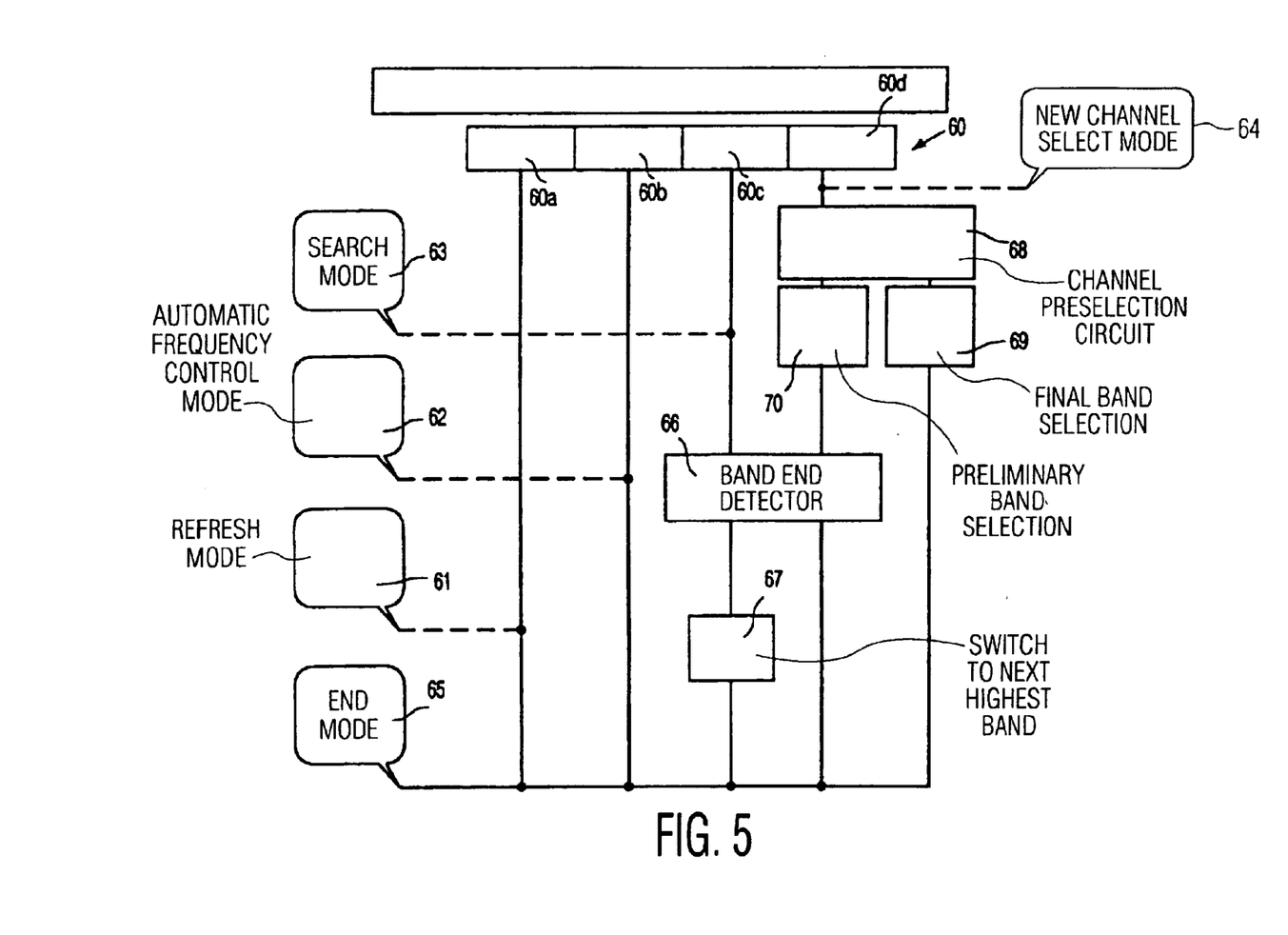
FIG. 5 is a functional diagram showing the principle of the band selection circuit of the tuner designed for selecting the frequency band.

FIG. 4 shows an alternative subdivision of the frequency band range of the terrestrial tuners, which may also be integrated as a band preselection circuit into the integrated circuit 5 of FIG. 1. In FIG. 5, the entire frequency band range is subdivided into a first group 55, a second group 56, and a third group 57. The first group 55 comprises the frequency band range from 45.25 MHz to 175.25 MHz, the second group 56 the frequency band range from 175.25 MHz to 471.25 MHz, and the third group 57 the frequency band range from 471.25 MHz to 863.25 MHz. It is provided for frequency information signals in the first group 55 that a switch is made first to the low frequency band LB for a reception channel to be newly adjusted and to attempt to tune to the desired frequency in this low frequency band LB. If this is not possible, an automatic switch is made to the mid-frequency band MB, and the tuning process is repeated there. It is provided for frequency information signals in the second group 56 that tuning is first attempted in the mid-frequency range MB for a frequency to be newly adjusted. If this is not possible, the tuner switches automatically to the high frequency band HB and tries to tune to the desired frequency in the high frequency band HB. The tuner switches immediately to the high frequency band HB for frequency information signals in the third group 57. An automatic frequency switch-over is not provided here. This embodiment has the advantage that the band preselection circuit has to subdivide the frequency information signals into three groups only. This simplifies the decoder. The boundaries of the first, the second, and the third group may be modified in dependence on the application. The software and the control electronics of a tuner with a band preselection circuit as shown in FIG. 4 can be used for all tuners whose switching points between the low frequency band LB and the mid-frequency band MB lie within the first group 55 and whose switching points between the mid-frequency band MB and the high frequency band HB lie within the second group 56.

In the overlap region IV, a frequency can be tuned both in the low frequency band LB and in the mid-frequency band MB. Since the noise and gain are more favorable in the low frequency band LB in the overlap region 4, it is advantageous to receive a reception signal present there in the low frequency band LB. Similarly, it is more favorable to receive a reception signal lying in the overlap region V in the mid-frequency band MB. It is accordingly more favorable in the second group 51 to start the tuning procedure first in the low frequency band LB, and it is more favorable in the third group 53 to start the tuning procedure in the mid-frequency band MB. It is ensured thereby that reception takes place in the relevant lower frequency band in the overlap regions IV and V.

FIG. 5 is a functional block diagram of the band selection circuit of the tuner provided for the selection of the frequency band, preferably integrated into the integrated circuit 5 of FIG. 1. In FIG. 5, the band selection circuit comprises a frequency difference detection circuit 60 which determines the frequency difference between an old frequency information signal and a new frequency information signal when a new frequency information signal is supplied to the tuner. The frequency difference detection circuit 60 is capable of subdividing the frequency differences between the old and the new frequency information signal into a first frequency difference range 60a, a second frequency difference range 60b, a third frequency difference range 60c, and a fourth frequency difference range 60d. In the first frequency difference range 60a, the old and the new frequency information signal are identical, and the band selection circuit is in the refresh mode 61. The band selection circuit has recognized in the refresh mode 61 that the same frequency information signal was once more supplied to the tuner. No frequency band switch-over is provided in such a case.

The band selection circuit accordingly enters the end mode 65 in which the supply of a new frequency information signal is awaited. In the second frequency difference range, the new frequency information signal differs only slightly from the old frequency information signal, preferably by only one bit in the case of digitally supplied frequency information signals. In such a case, the band selection circuit is in an automatic frequency control mode 62, i.e. the band selection circuit recognizes that the TV set is carrying out a frequency fine tuning of the received channel. In such a case, again, no frequency band switch-over is desirable, and the band selection circuit is accordingly switched to the end mode 65 again. The third frequency difference range 60c corresponds to a search mode 63. TV sets have such a search mode for a systematic scanning of the individual frequency bands in search of receivable TV channels. In such a case, the microprocessor of the TV set increases the frequency information signal supplied to the tuner continuously in frequency steps of programmable size. The size of these frequency steps lies typically in a frequency range of between 62.5 kHz and 1 MHz. When such a search mode is implemented by the microprocessor of the TV set, a frequency band switch-over is carried out only when the end of the respective frequency band is reached. In the search mode, accordingly, a band end detector 66 tests whether the end of the respective frequency band, in which the search mode is active at that moment, has been reached. This may take place, for example, through monitoring of the tuning voltage. When the band end detector 66 detects the band end, the tuner switches to the next higher frequency band. This is represented by block 67 in FIG. 5. The fourth frequency range distinguished by the frequency difference detection circuit 60 is a frequency difference range 60d, which means that the tuner is set for a new-channel selection mode 64. In this new-channel selection mode, the frequency difference detection circuit 60 detects that the tuner receives a frequency information signal which corresponds to a channel to be newly tuned. This detection is realized in that the frequency difference between the old and the new frequency information signal exceeds a programmable minimum value. The distance between the individual channels is usually 7 MHz in terrestrial broadcasting stations. The threshold value for the fourth frequency difference range 60d should accordingly be chosen to lie somewhat below this channel distance, preferably at approximately 5 MHz. This means that the tuner enters the new-channel selection mode 64 in the case of newly supplied frequency information signals which are at least 5 MHz removed from the old frequency information signal. In the new-channel selection mode 64, a channel preselection circuit 68 first makes a preliminary selection of the frequency band. The channel preselection circuit 68 comprises, for example, an assignment function designed in accordance with FIG. 3 or 4, which assigns the supplied frequency information signal either unequivocally to one of the frequency bands or merely makes a preliminary choice and carries out a switch-over as required. If the channel preselection circuit 68 is constructed as shown in FIG. 3, for example, then an unequivocal and final band selection is made in the case of frequency information signals lying within the first group 50, the third group 52, or the fifth group 54. This is represented by block 69. The band selection circuit then enters the end mode 65 and waits for a newly supplied frequency information signal. However, if the frequency information signals supplied to the tuner lie in the second group 51 or the fourth group 53, a preliminary selection of the frequency band is merely made in block 70, i.e. a switch is made to the low frequency band LB in the case of the second group 51 and to the mid-frequency band MB in the case of the fourth group 53. If tuning in the low frequency band LB is not possible for the second group 51, this will be detected by the band end detector 66, and a band switch-over to the mid-frequency band MB will be carried out in block 67. Similarly, it is first attempted for the fourth group 53 to tune in the mid-frequency band MB. Any failure here will be detected by the band end detector 66, and a switch-over to the high frequency band HB will be made in block 67.

Figure 6:
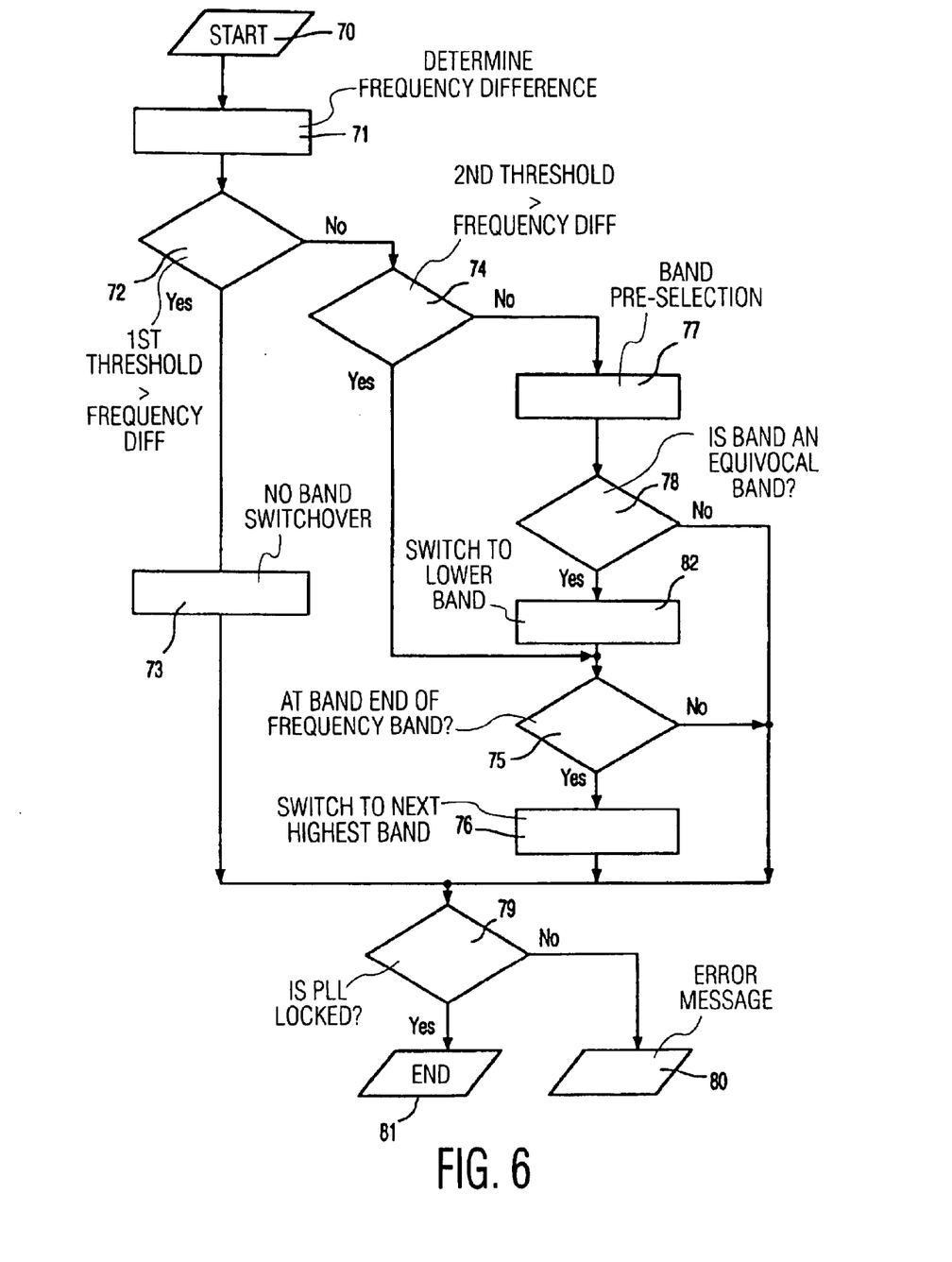
FIG. 6 is a flow chart showing the procedure of the band selection by means of the band selection circuit.

FIG. 6 is a flow chart showing the principle of the process of selecting a band when a new frequency information signal is supplied to the tuner. The block 70 represents the start, i.e. a new frequency information signal is supplied to the tuner. In the next block 71, the frequency information signal newly supplied to the tuner is compared with the old frequency information signal and the frequency difference is determined. It is then tested in block 72 whether the detected frequency difference is to lead to the refresh mode or automatic frequency control mode on the one hand or to the search mode or the new-channel selection mode on the other hand. This is realized by means of a threshold value test, i.e. it is tested whether the frequency difference lies below a first threshold value or above this first threshold value. The first threshold value is to be defined such that the frequency differences of the automatic frequency control mode lie below this threshold value and the frequencies of the search mode and the new-channel selection mode lie above the threshold value. If it is detected in block 72 that the frequency difference information signal lies below the first threshold value, a step is made to block 73, which signifies that no band switch-over is provided. If it is determined in block 72 that the supplied frequency difference signal lies above the first threshold value, it is tested in block 74 whether the frequency difference lies below or above a second threshold value. This second threshold value is so chosen that it renders possible a distinction between the search mode and the new-channel selection mode. If the frequency difference signal lies below the second threshold value, the tuner enters the search mode and block 75 is directly accessed, where it is tested whether the band end of the frequency band switched on at that moment has been reached. If this is the case, a switch is made to the next higher frequency band in block 76. In the opposite case, no frequency band switch is provided. Now if it is detected in block 74 that the frequency difference signal lies above the second threshold value, the tuner will enter the new-channel selection mode, and a band preselection is made by means of a band preselection circuit, for example a preselection circuit as shown in FIG. 3, in block 77, i.e. the frequency difference signal is associated with one of the five groups 50 to 54, and the frequency band belonging to this group is switched on. It is tested in the next block 78 whether the group determined in block 77 is an unequivocal or an equivocal group, i.e. whether the frequency information signal lies within the first group 50, the third group 52, or the fifth group 54, which are each unequivocally associated with one frequency band, or whether the frequency information signal lies in the second group 51 or the fourth group 53, which are each associated with two frequency bands. In the former case, i.e. in the unequivocal groups 50, 52, and 54, no further band switch is provided and the process proceeds directly to block 79. It is tested in block 79 whether the PLL oscillator of the tuner has been latched to the desired reception frequency. If this is not the case, an error message is given in block 80. If the latching to the desired reception frequency was successful, the tuning process is successfully completed in block 81. If it is found in block 78 that the frequency information signal lies in the second group 51 or the fourth group 53 of the example of FIG. 3, block 82 first switches to the lower of the two frequency bands, i.e. to the low frequency band LB in the second group 51 and to the mid-frequency band MB in the fourth group 53. Then a test is provided in block 75 as to whether the frequency band end has been reached. If this is not the case, no band switch-over is provided. If the frequency band end is detected in block 75, a switch-over is made to the next higher frequency band in the next block 76, i.e. to the mid-frequency band MB in the second group 51 and to the high frequency band HB in the fourth group 53. It is then tested in block 79 whether the PLL oscillator has latched to the desired reception frequency. If so, the tuning process is successfully completed in block 81. If not, an error message is given in block 80.

Figure 7:
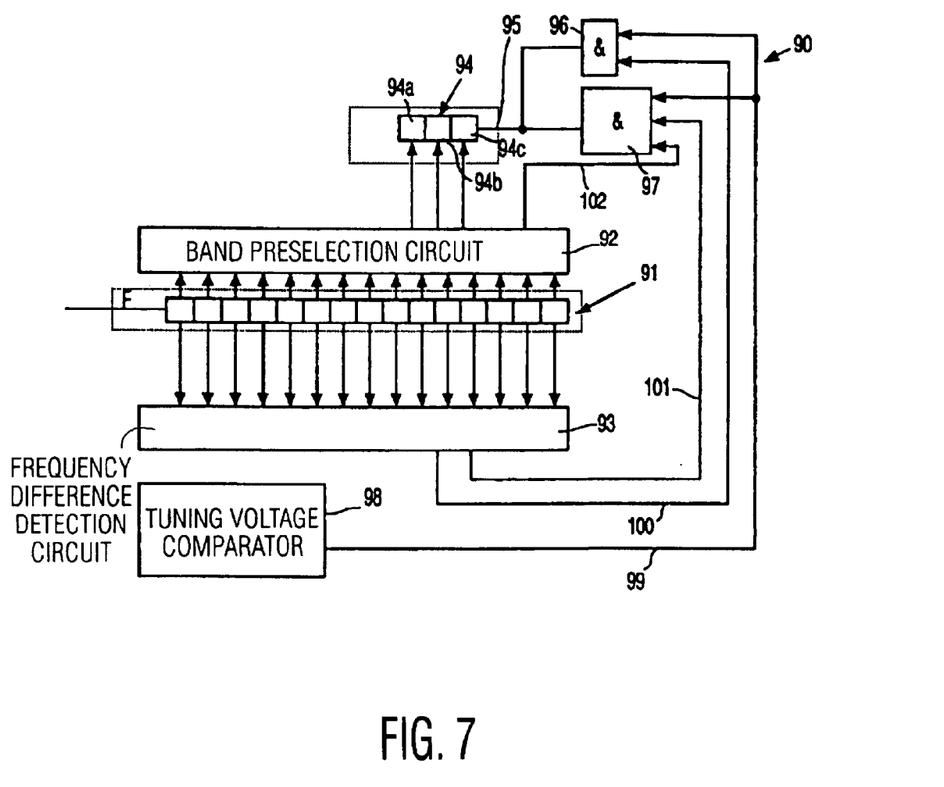
FIG. 7 is a block diagram showing the operating principle of the band selection circuit.

FIG. 7 shows a hardware implementation of a band selection circuit 90. The band selection circuit 90 comprises an input register 91 to which a frequency information signal F can be supplied in digital form via, for example, an I²C bus of the TV set. The input register 91 comprises 14 memory locations for digital storage of the frequency information signals F. The input register 91 is coupled at one side to a band preselection circuit 92 and at the other side to a frequency difference detection circuit 93. The frequency information stored in the input register 91 is supplied in parallel fashion to the band preselection circuit 91 and the frequency difference detection circuit 93. A frequency assignment table is implemented in the band preselection circuit 92, such as described, for example, with reference to FIGS. 3 and 4. The frequency band selected by the band preselection circuit 92 is written in digital form into a shift register 94. The shift register 94 comprises a first memory field 94a, a second memory field 94b, and a third memory field 94c. The memory field 94a is provided as the control information for the low frequency band LB, the second memory field 94b as the control information for the mid-frequency band MB, and the third memory field 94c as the control information for the high frequency band HB. The shift register 94 is cyclically constructed, i.e. the memory information in the first memory field 94a is written into the third memory field 94c upon the next shifting clock pulse. The frequency difference detection circuit 93 determines the frequency difference between the old and the new frequency information signal F. The control of the shift register 94 is effected via a control line 95 which is coupled to the output of an AND circuit 96 and to the output of an AND circuit 97. The band selection circuit 90 comprises a tuning voltage comparator 98 as the band end detector, which compares the tuning voltage, by means of which the band-pass filter and the oscillator of the relevant frequency band are controlled, with a reference voltage. If the tuning voltage lies above this reference voltage, the tuning voltage comparator 98 generates a positive control bit "1" and supplies this through a control line 99 to the input of the AND circuit 96 on the one hand and to the input of the AND circuit 97 on the other hand. The frequency difference detection circuit 93 supplies a positive control bit "1" through a control line 100 to the AND circuit 96 if the detected frequency difference signal lies, for example, within a range from 2 to 16 digital frequency steps. This corresponds to the search mode. The frequency difference detection circuit 93 supplies a positive control bit "1" to the AND circuit 97 if the frequency difference detected by the frequency difference detection circuit is, for example, greater than 80 digital frequency steps. In this case the new-channel selection mode is to be set. The band preselection circuit 92 supplies a positive control bit "1" via a control line 102 to the AND circuit 97 if the frequency of the supplied frequency information signal lies in an equivocal group, i.e. for example in the second group 51 or the fourth group 53 in a band preselection circuit as described in FIG. 3. In such a case, a switch is to be made to the next higher frequency band if the search in the originally selected frequency band was unsuccessful. The AND circuit 96 supplies a control signal for band switch-over to the shift register 94 only if the band end is signaled by the tuning voltage comparator via the control line 99, i.e. when the end of the respective frequency band has been reached, and if the frequency difference detection circuit 93 signals via the control line 100 that the newly supplied frequency signal belongs to the search mode, i.e. that the TV set scans the frequency bands in succession in search of receivable channels.

The AND circuit 97 supplies a control signal for band switch-over to the shift register 94 only if the tuning voltage comparator signals the band end via the control line 99, if the frequency difference detection circuit 93 signals via the control line 101 that the newly supplied frequency signal belongs to a new reception channel, and if at the same time the band preselection circuit 92 signals via the control line 102 that the newly supplied frequency information signal lies in an equivocal range, in which a band switch-over may be necessary.

What is claimed is:

1. A tuner with at least a first and a second frequency band and with a signal input terminal for the supply of a frequency information signal, comprising:

a band selection circuit which is provided for the selection and control of one frequency band at a time, and the band selection circuit includes a band preselection circuit for setting a new frequency, the band preselection circuit being adapted to carry out a preliminary selection of the frequency band in dependence on the frequency information signal, and the preselection circuit is adapted to distinguish between unequivocal frequency information signals, which can be unequivocally associated with one frequency band, and equivocal frequency information signals which cannot be unequivocally associated with one frequency band, wherein in the case of equivocal frequency information signals in a first step the testing of the tuning possibility of the frequency in the first frequency band is provided and, if tuning in the first frequency band is not possible, in a second step the testing of the tuning possibility of the frequency in the second frequency band is provided; and a frequency search function for tuning to a frequency, which function in a first step is adapted to test the tuning possibility of the frequency in the first frequency band and, if tuning in the first frequency band is not possible, in a second step is designed for testing the tuning possibility of the frequency in the second frequency band.

2. A tuner as claimed in claim 1, wherein the band selection circuit comprises a frequency difference detection circuit which is designed for determining the frequency difference between the old and the new frequency information signal in the case of newly supplied frequency information signals, and for selecting a tuning mode which influences the band selection on the basis of the detected frequency difference.

3. A tuner as claimed in claim 2, wherein the tuning modes which the frequency difference detection circuit is capable of distinguishing are a refresh mode, an automatic frequency control mode, a search mode, and a new-channel selection mode, in that a renewed supply of the same frequency information signal is provided in the refresh mode, in that the supply of an only slightly modified frequency information signal for automatic fine frequency tuning of a selected frequency is provided in the automatic frequency control mode, in that the consecutive supply of frequency information signals increased by a programmable frequency each time for scanning one or several frequency bands in search of receivable channels is provided in the search mode, and in that the supply of a frequency information signal of a new channel is provided in the new frequency selection mode, no frequency band change being provided in the refresh mode and the automatic frequency control mode, while in the search mode a frequency band change is provided only when the end of the frequency band is reached, and in the new-channel selection mode the frequency band selection takes place by means of the frequency search function.

4. A tuner as claimed in claim 1, wherein the band preselection circuit is designed for subdividing the frequency information signals into at least two groups, in that the first group comprises those frequency information signals which can be unequivocally associated with the first frequency band and which can be equivocally associated either with the first or with the second frequency band, in that the second group comprises those frequency information signals which can be unequivocally associated with the second frequency band, and in that a test of the tuning possibility of the frequency in the first frequency band is provided for the first group in a first step and, if tuning in the first frequency band is not possible, a test of the tuning possibility of the frequency in the second frequency band is provided.

5. A tuner as claimed in claim 1, wherein the band preselection circuit is provided for subdividing the frequency information signals into at least three groups, in that the first group comprises those frequency information signals which can be unequivocally associated with the first frequency band, in that the second group comprises those frequency information signals which can be equivocally associated either with the first or with the second frequency band, in that the third group comprises those frequency information signals which can be unequivocally associated with the second frequency band, and in that a test of the tuning possibility of the frequency in the first frequency band is provided in a first step for the second group and, if tuning in the first frequency band is not possible, a test of the tuning possibility of the frequency in the second frequency band is provided in a second step.

6. A tuner as claimed in claim 1, wherein the band selection circuit comprises a band end detector which is designed for evaluating the tuning voltage of the tuning capacitance of the relevant frequency band and which is designed for supplying a control signal when a given threshold value is exceeded.

7. A tuner as claimed in claim 6, wherein the band selection circuit comprises a cyclical shift register with n elements for controlling the frequency bands, n corresponding to the number of frequency bands of the tuner, in that each of the n elements acts as the control information for a respective one of the n frequency bands, in that said shift register is controllable by means of the control signal of the band end detector, and in that upon detection of the band end a serial shift of the control information in the shift register and a resulting band switch-over to the next frequency band are provided.

8. A tuner as claimed in claim 1, wherein the first frequency band, which is scanned by means of the frequency search function in the first step, has a frequency value which lies below that of the second frequency band.

9. A TV apparatus comprising a tuner as claimed in claim 1.

10. A tuner as claimed in claim 1, wherein the band selection circuit is a component of an integrated circuit.

* * * * *